United States Patent [19]

Newman

[11] Patent Number: 5,648,189
[45] Date of Patent: Jul. 15, 1997

[54] PIN REGISTRATION FOR SCREEN PRINTING

[75] Inventor: Don E. Newman, Wyncote, Pa.

[73] Assignee: Stretch Devices, Inc., Philadelphia, Pa.

[21] Appl. No.: 549,590

[22] Filed: Oct. 27, 1995

[51] Int. Cl.$^6$ .................... G03F 9/00; B41C 1/14; B41F 15/36

[52] U.S. Cl. .............. 430/22; 101/127.1; 101/128.1; 101/128.4; 33/617; 33/614

[58] Field of Search .................. 430/22; 101/127.1, 101/128.1, 128.4; 33/615, 617, 614

[56] References Cited

U.S. PATENT DOCUMENTS

| Re. 32,731 | 8/1988 | Jennings et al. ............... 101/35 |
|---|---|---|
| 1,072,908 | 9/1913 | Buda ............................... 33/16 |
| 2,680,405 | 8/1954 | Faeber et al. ............... 101/401.2 |
| 2,701,420 | 2/1955 | Monroy et al. ............... 33/184.5 |
| 3,098,431 | 7/1963 | Weaver ............................ 101/126 |
| 3,492,900 | 2/1970 | Hill et al. ........................ 83/464 |
| 3,943,851 | 3/1976 | Inada et al. ................... 101/127.1 |
| 4,223,055 | 9/1980 | Castelluzzo et al. ............ 428/40 |
| 4,226,181 | 10/1980 | Ericsson ........................ 101/129 |
| 4,438,693 | 3/1984 | Serrianne et al. ............. 101/129 |
| 4,516,495 | 5/1985 | Ericsson ........................ 101/129 |
| 4,612,856 | 9/1986 | Jennings ....................... 101/129 |
| 4,738,909 | 4/1988 | Jennings ....................... 430/22 |
| 4,901,638 | 2/1990 | Jennings ....................... 101/126 |
| 4,911,070 | 3/1990 | Miske et al. ................... 101/126 |
| 4,938,130 | 7/1990 | Thorpe .......................... 101/126 |
| 4,972,773 | 11/1990 | Barlow ........................ 101/127.1 |
| 4,993,166 | 2/1991 | Bradley ......................... 36/619 |
| 5,094,155 | 3/1992 | Jennings ...................... 101/127.1 |
| 5,094,161 | 3/1992 | Taylor .......................... 101/129 |
| 5,099,757 | 3/1992 | Jennings ...................... 101/115 |
| 5,127,176 | 7/1992 | Newman ....................... 38/102.1 |
| 5,163,367 | 11/1992 | Newman ....................... 101/127 |
| 5,188,026 | 2/1993 | Fuqua et al. .................. 101/129 |
| 5,226,366 | 7/1993 | Schlife et al. ................. 101/485 |
| 5,315,929 | 5/1994 | Sundqvist .................... 101/127.1 |
| 5,377,422 | 1/1995 | Newman ....................... 33/620 |
| 5,410,385 | 4/1995 | Ohlig ........................... 355/91 |
| 5,503,068 | 4/1996 | Newman ....................... 101/126 |
| 5,522,148 | 6/1996 | Newman ....................... 33/620 |

FOREIGN PATENT DOCUMENTS

| 0334072 | 9/1989 | European Pat. Off. . |
|---|---|---|
| 1 564 498 | 4/1990 | United Kingdom . |
| 2 067 468 | 7/1991 | United Kingdom . |

OTHER PUBLICATIONS

Richardson Brochure, date unknown.
Venell, "Preregistration" Jul. 1983.
Diamond Pin Systems 1993 Brochure.

Primary Examiner—John A. McPherson
Attorney, Agent, or Firm—Seidel, Gonda, Lavorgna & Monaco, PC

[57] ABSTRACT

A pin registration bar aligning an image film to a screen mesh of a screen printing frame. The pin registration bar has a bar and a plate. The bar has an upper surface, a lower surface, and a pair of side surfaces. The plate has a pair of generally parallel surfaces. A portion of one of the parallel surfaces engages the upper surface of the bar. The plate is mounted to the upper surface of the bar. The plate projects outward over one of the side surfaces. The pin registration bar has a pair of sets of pins. The first set of pins projects upward from the other parallel surface of the plate for aligning with holes in the image film. The second set of pins projects downward from the one of the parallel surfaces of the plate for aligning with openings carried by the screen printing frame.

13 Claims, 8 Drawing Sheets

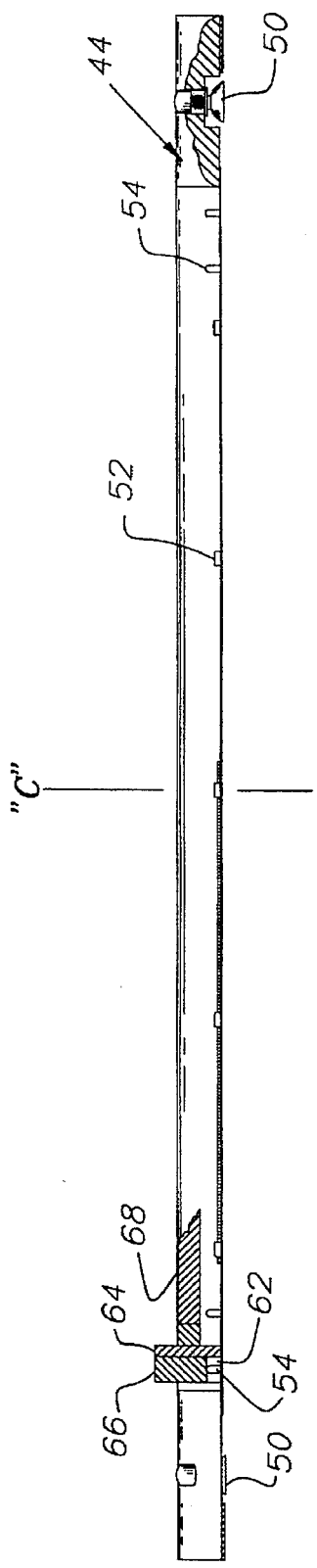
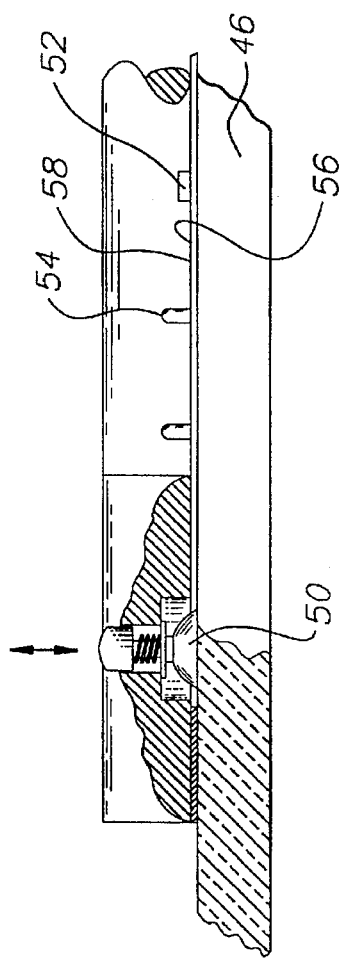
FIG. 2 (PRIOR ART)
FIG. 2a (PRIOR ART)

PIN REGISTRATION FOR SCREEN PRINTING

FIELD OF THE INVENTION

This invention relates to a registration system for screen printing, and more particularly to a registration system for properly positioning the image on a screen fabric or screen mesh.

BACKGROUND OF THE INVENTION

In the majority of screen printing operations, more than one color is used to create the desired image on a substrate, such as a shirt or poster. The use of more than one color results in using several screens, one for each color, wherein each screen has the associated image for that color. It is therefore necessary to ensure that the images from each screen are aligned properly with each other, so that each associated color is aligned properly on the substrate, as quickly as possible for economic reasons.

The process consist of the final image being divided up into multiple images which are each a single color. These images can be half-tones (i.e, dots), lines, or areas. A film containing the appropriate image is produced for each specific color. In some instances, two image films can be produced for a single color. For example, when it is desired to place a color as a background and then use the same color for a detail on top of an intermediate printed color, two image films would be used.

Once the image films are ready, a screen mesh is prepared. The screen mesh is held at a proper tension in a screen printing frame and carries a light sensitive coating on film. The screen mesh is placed in contact with the image film on an exposure table. The films are placed in relative alignment and the images are burned into (transferred to) the light sensitive coating on the screen priming frame. The exposure table has a single source light, such as carbon metal hallide arc or a mercury vapor light, to transfer the image.

In order to ensure that the films do not move relative to each other during processing, the exposure table has a vacuum blanket overlying the glass table. A vacuum created between the glass table and the vacuum blanket pulls the film having the image into complete intimate contact with the screen mesh containing the light sensitive emulsion or coating. After the image is burned into the emulsion or coating on the screen mesh, the screen mesh is washed with water to remove the unexposed coating to make the image on the screen mesh relatively permanent.

The screen printing frames, each containing a screen mesh having an image, are placed in a printing machine having several stations; one station for each image. Several test prints are taken to determine if the printed image from each color/screen is aligned. The images of the multiple screen printing frames are adjusted by moving the screen printing frames relative to the printing machine so that the multiple colors are aligned properly in the printing machine to achieve The desired image.

It has been recognized that the more consistent the alignment of each image on the screen mesh in each of the screen printing frames, the less time and effort that is typically required to precisely align the screen printing frames within the printing machine to arrive at production printing.

One prior method of ensuring consistent positioning of the images on the screen fabrics of the screen printing frames for a screen printing job having numerous colors, involves placing the various images 20 on various image films 22 and aligning the various image films 22 on a lay-up board 24. As seen in FIG. 1, the lay-up board 24 has a registration bar 26 secured to one end. The registration bar 26 has a plate 28 from which a set of pins 30 project upward for receiving a plurality of holes 32 in the image film 22 containing an image.

The lay-up board 24 has a series of lines 34 for assisting in the lay-up. The various images (at least one for each color) are placed on a film in a photographic process which is well-known in the art. The film is either punched with the holes or aligned and secured on a carrier sheet having the holes to create the image films 22. After all the images 20 on the various image films 22 are aligned on the lay-up board 24 and have the punched holes, the image 20 on each image film 22 needs to be transferred to a screen printing film 40 carried by a screen mesh 38 of a screen printing frame 42.

Referring to FIG. 4, a pin registration bar 44 is secured to a glass table 46 of an exposure table 48 using a pair of suction cups 50, as seen in FIG. 2A. The pin registration bar 44 has two sets of pins 52 and 54 projecting upward from an upper surface 56 of a plate 58. One set of upwardly projecting pins 52 is adapted to be received by the holes 32 located in the image film 22. Referring to FIG. 2, the second set of pins 54 are located outboard of the first set of pins 52 and are symmetric about a center line "C".

Referring to FIG. 3, the pin registration bar 44 is shown in perspective. The first set of pins 52 project upward from the upper surface 56 of the plate 58. The series of pins 52, which are symmetric about the center line "C", have a plurality of square shaped pins 52a and one circular shaped pin 52b located at the center line "C" of the pin registration bar 44. The second set of pins 54, which likewise project upward from the upper surface 56 of the plate 58, are spaced outward of the first set of pins 52.

Referring back to FIG. 4, the image film 22 for a specific color and an associated screen printing frame 42 is laid on the glass table 46 with the holes 32 of the image film 22 receiving the first set of pins 52 on the pin registration bar 44. In that the image film 22 has both circular and square holes 32, the image film 22 cannot be mis-aligned.

With the image film 22 located on the glass table 46, the screen printing frame 42, which has the screen printing film 40 on the screen mesh 38, is positioned such that a pair of openings 62 carried by the screen printing frame receives two of the second set of pins 52, as seen in FIG. 2. The opening 62, such as a hole or a slot, is located in a comer member 64 or associated parts of the screen printing frame 42, such as a registration adapter 66 as seen in FIG. 2. The openings 62 on the screen printing frame 42 are positioned such that those pins 54 which project upward from the plate 58 of the pin registration bar 44 and are not received by the openings 62, do not interfere with the tensioning rollers 68 of the screen printing frame 42. The pins 54 are located closer to the bar portion of the pin registration bar 26 than the longitudinal axis of the tensioning roller 68.

A vacuum blanket 72 of the exposure table 48 is lowered onto the screen printing frame 42 and the glass table 46 and a vacuum is drawn to ensure that there no movement between the films 22 and 40. The exposure table 48 has a light source, not shown, which underlies the glass table 46 for exposing the screen printing film 42 located on the screen mesh 38 of the screen printing frame 40. The high intensity light bums the image 20 located on the image film 22 into the screen printing film 40 by sending light through the image film 22 onto the screen printing film 40, at specific locations, therein transferring the image 20 from the image film 22 to the screen printing film 40. With the image 22 on the screen mesh 38 of the screen printing frame 42, the screen mesh 38 including the screen printing film 40 is treated so that the screen printing film 40 is ready to print.

Referring to FIG. 5, with the image 22 properly aligned and treated on the screen printing film 40 carried by the screen mesh 38 of the screen printing frame 42, the screen printing frame 42 is placed in a "U" shaped channel 74 of a screen printing machine. The "U" shaped channel 74 has a plate 78 through which a series of pins 80 project upward, only one seen. The "U" shaped channel 74 with the plate 78 and pins 80 acts as a registration apparatus 82. U.S. Pat. No. 5,377,422 discloses such a pin registration system for screen printing frames, and is incorporated herein by reference. The series of pins 80 are positioned similar to the second set of pins 54 on the pin registration bar 44. The hole (opening) 62 of the registration adapter 66 of the screen printing frame 42 receives one of the pins 80 located in the plate 78 to position the screen printing frame 42 relative to the registration apparatus 82 of the screen printing machine. The other registration adapter 66 of the screen printing frame 42, associated with another corner member 64, has a slot as the opening to assist in the alignment by preventing rotation of the screen printing frame 42 about the pins 80/hole 62 connection.

With the screen printing frame 42 properly aligned in the screen printing machine, the screen printing frame 42 moves relative to the substrate to move the screen mesh 38 in proximity to the substrate, not shown, allowing the transfer of the image from the screen printing film 40 to the article. In that the image 22 has been aligned precisely from the image film 22 to the screen printing film 40 on the screen printing frame 42, and the screen printing frame 42 has been mounted precisely on the printing machine, the images from the multiple screen printing frames 42 on the printing machine should align precisely on the substrate. Any alignment of the screen printing frames 42 required within the machine should be minor to perfect the image.

One of the shortcomings of this method is that this pin registration bar cannot be used with an exposure table which has the vacuum blanket located under the glass table during alignment, referred to as a glass-up exposure table. In addition, lateral forces which might develop on the screen printing frame, the pin registration bar, and the image film, when a vacuum is being drawn on the exposure table could result in the screen printing frame and the image sheet shifting relative to each other, at the end not engaging the registration bar. If the screen printing frame shifts relative to the image film, the shift on each screen printing frame/image film would likely not be the same, for each of the colors, therein resulting in non-proper alignment for multiple color final image.

It is desired to have a means of ensuring alignment of the image films to the film on the screen mesh during exposure for a glass-up vacuum table and to ensure that lateral forces do not create shifting of the image. In addition, it is desired to be able to use a single apparatus to produce multiple screen printing frames on a single exposure table at one time.

SUMMARY OF THE INVENTION

The invention resides in a pin registration bar for aligning an image film to a screen mesh of a screen printing frame. The pin registration bar has a bar and a plate. The bar has an upper surface, a lower surface, and a pair of side surfaces. The plate has a pair of generally parallel surfaces. A portion of one of the parallel surfaces engages the upper surface of the bar. The plate is mounted to the upper surface of the bar. The plate projects outward over one of the side surfaces. The pin registration bar has a pair of sets of pins. The first set of pins projects upward from the other parallel surface of the plate for aligning with holes in the image film. The second set of pins projects downward from the one of the parallel surfaces of the plate for aligning with openings carried by the screen printing frame.

In a preferred embodiment, the distance between the upper surface and the lower surface of the bar is generally equal to the height of the screen printing frame and the bar has a plurality of adjustable legs carried by the lower surface of the bar for adjusting the height of the bar.

Further objects, features and advantages of the present invention will become more apparent to those skilled in the art as the nature of the invention is better understood from the accompanying drawings and detailed descriptions.

BRIEF DESCRIPTION OF THE DRAWINGS

For the purpose of illustrating the invention, there is shown in the drawings a form which is presently preferred; it being understood, however, that this invention is not limited to the precise arrangements and instrumentality shown.

FIG. 2 is a side view of a prior art pin registration bar with portions broken away;

FIG. 2A is an enlarged side view of one end of the prior art pin registration bar showing details of a suction cup retention system;

DETAILED DESCRIPTION OF THE DRAWINGS

Figures 6, 6A:
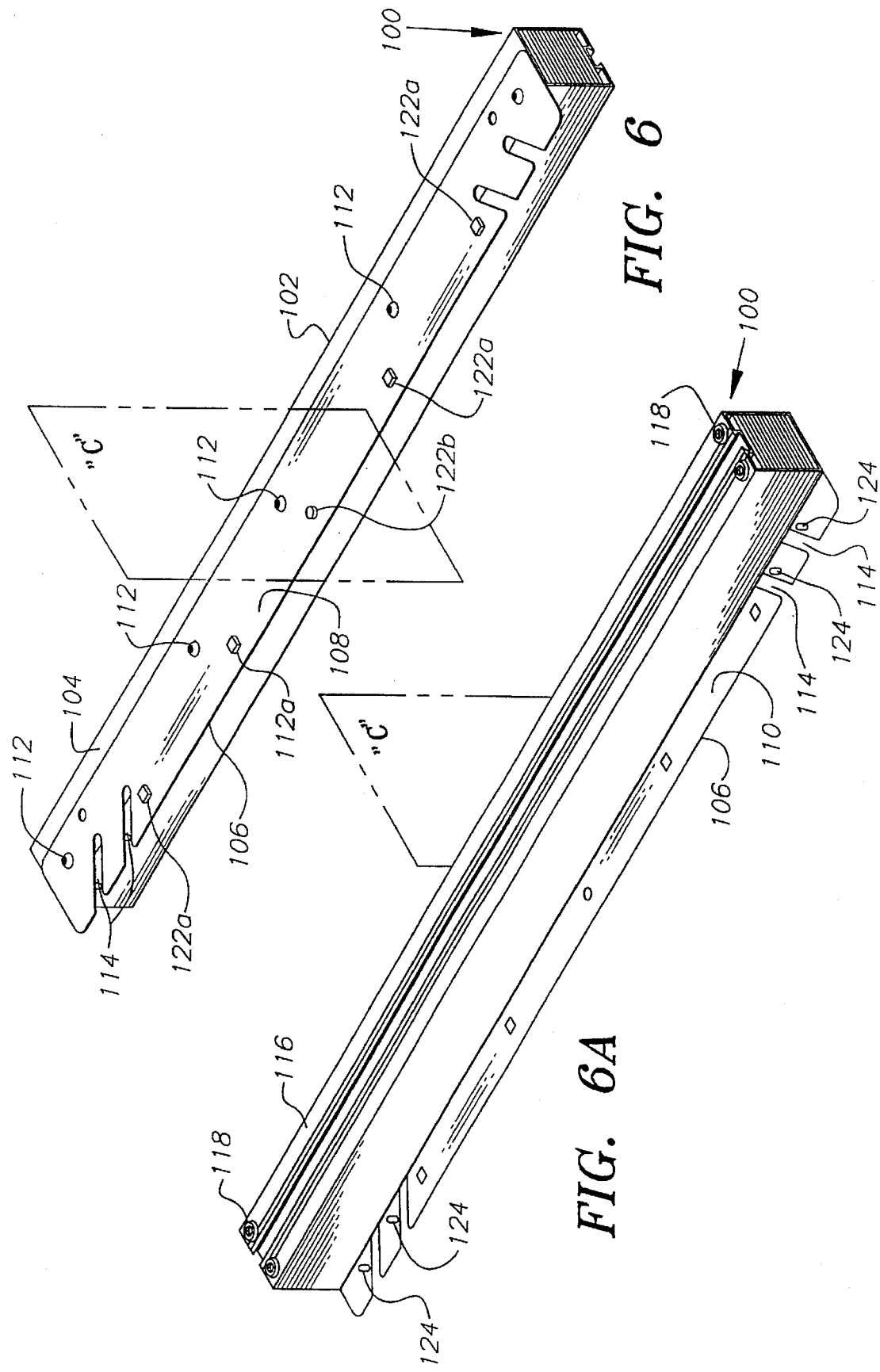
FIG. 6 is a perspective view of a pin registration bar according to the invention shown.
FIG. 6A is a perspective view of a pin registration bar according to the invention shown.

Referring to the drawings, where like elements are identified by like numerals, there is shown in FIG. 6 an embodiment of a pin registration bar according to the invention.

Referring to FIG. 6, the pin registration bar 100 is shown in perspective. The pin registration bar 100 has a bar portion 102. The bar portion 102 has an upper surface 104 upon which a plate 106 is mounted. The plate 106 has a pair of generally planar surfaces which are parallel to each other, an upper surface 108, as seen in FIG. 6, and a lower surface 110, as seen in FIG. 6A. The lower surface 110 of the plate 106 engages the upper surface 104 of the bar portion 102. A series of rivets 112 secure the plate 106 to the bar portion 102. The plate 106 has a series of grooves 114 which are symmetric about a center plane or line "C".

Referring to FIG. 6A, the bar portion 102 of the pin registration bar 100 has a lower surface 116. The pin registration bar 100 has a set of adjustable legs 118 projecting downward from the lower surface 116 of the bar portion 102.

Referring back to FIG. 6, the pin registration bar 100 has a first alignment means such as a first set of pins 122 which project upward from the upper surface 108 of the plate 106. The first set of pins 122 consists of a series of pins symmetric about the center line "C". In a preferred embodiment, the set of pins 122 has five (5) pins which consist of a plurality of square shaped pins 122a and one circular shaped pin 122b located at the center line "C" of the pin registration Referring to FIG. 6A, the pin registration bar 100 has a second alignment means such as a second set of pins 124 which project downward from the lower surface 110 of the plate 106. In a preferred embodiment, the second set of pins 124 consists of four (4) pins. The second set of pins 124, in addition to being located on the other surface 110 of the plate 106, are spaced outward of the first set of pins 122 relative to the center line "C". In addition, each of the pins 124 of the second set is spaced slightly outward of the groove 114 in the plate 106.

Figure 7:
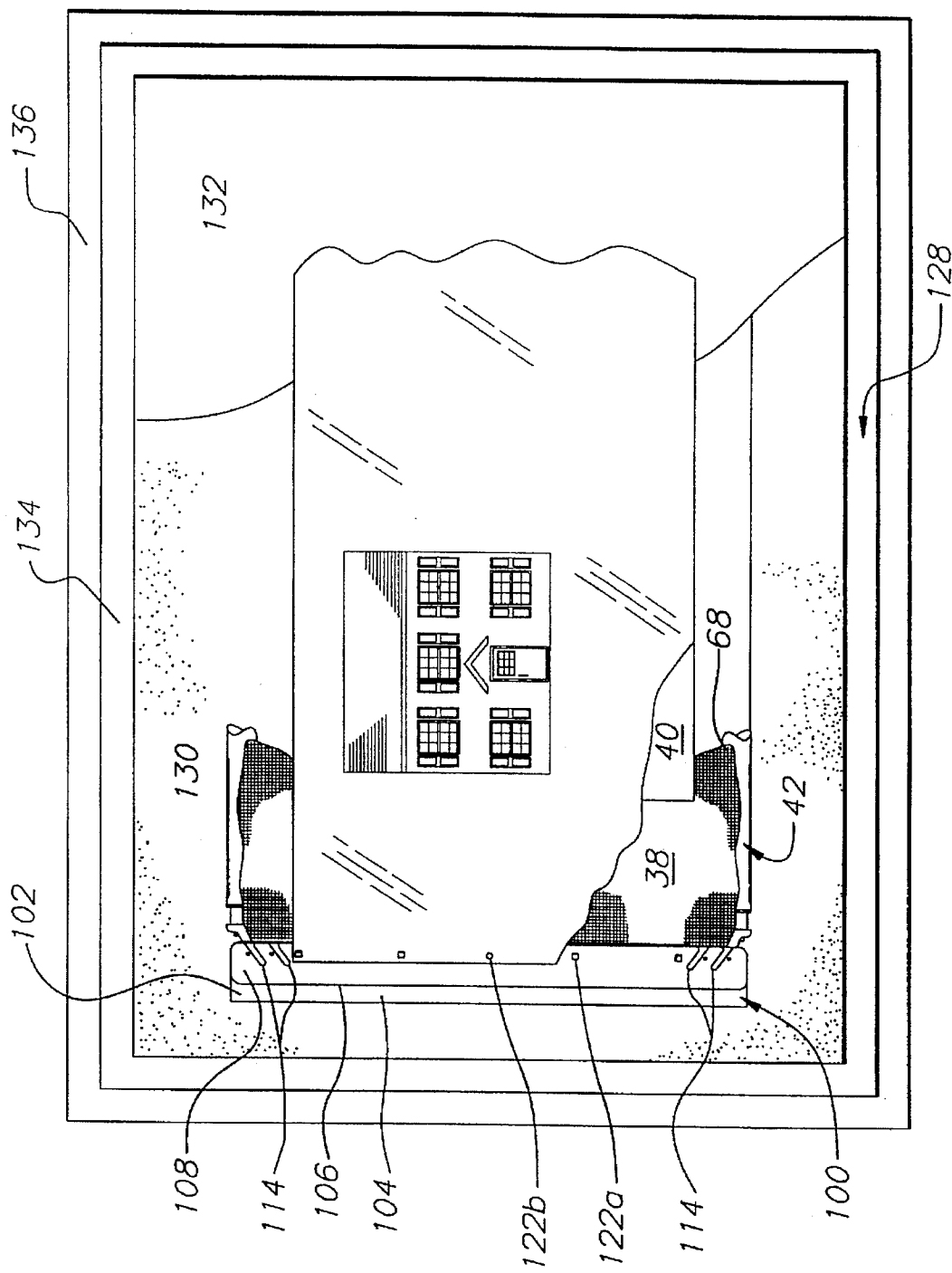
FIG. 7 is a top view of the pin registration bar of this invention on a vacuum blanket of a glass-up exposure table with portions of a screen frame and a film shown.

Referring to FIG. 7, the pin registration bar 100 according to the invention is shown in conjunction with a glass-up exposure table 128 and a screen printing frame 42. The screen printing frame 42 has a plurality of tensioning rollers 68, only a portion of two are shown, for holding the screen mesh 38 at the proper tension. The exposure table 128 is used to transfer an image 20 from an image film 22 to a screen printing film 40 on the screen mesh 38 by sending light through the image film 22 onto the screen printing film 40.

Figure 4:
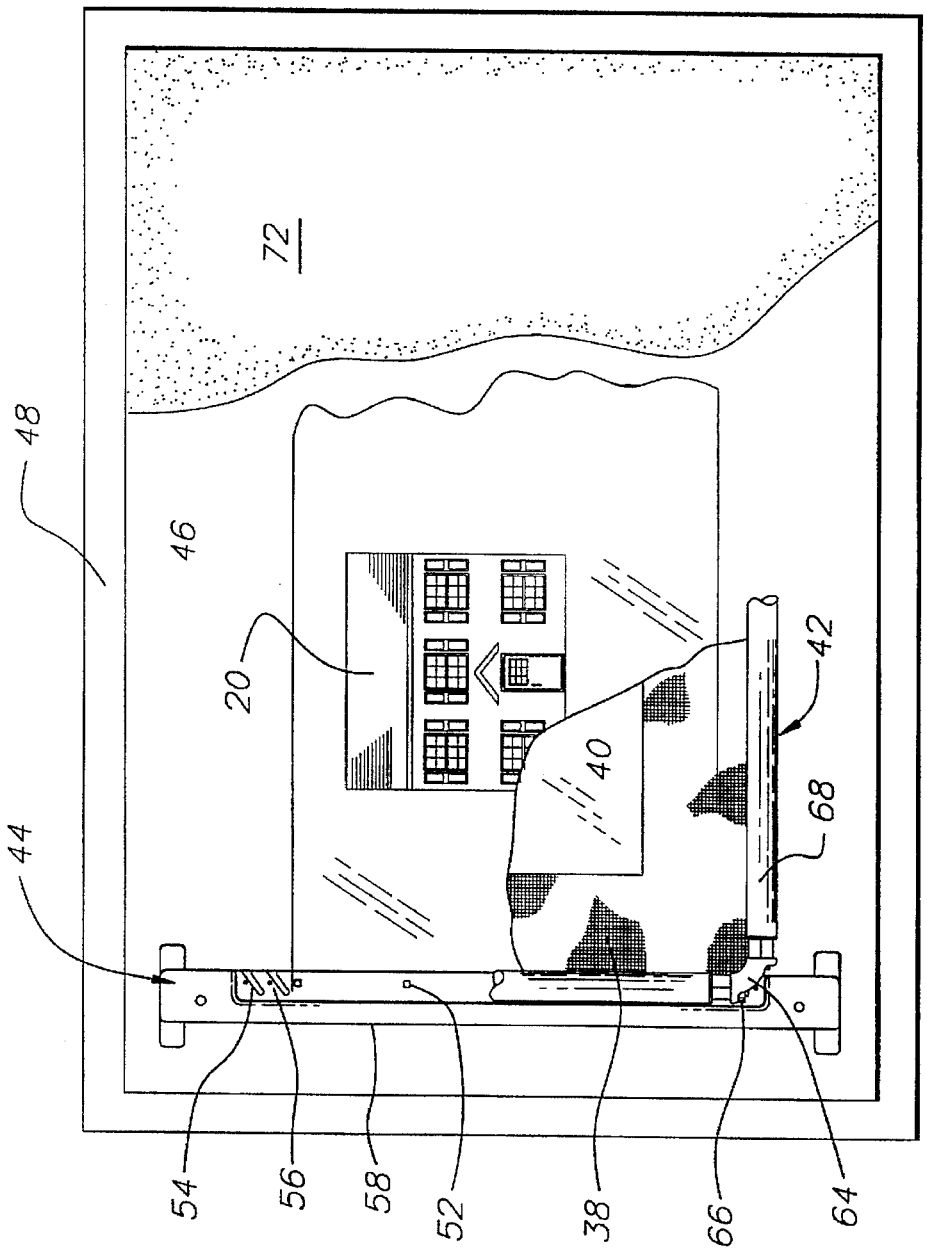
FIG. 4 is a top view of the prior art pin registration bar on an exposure table with portions of a screen frame and an image film shown.

The glass-up exposure table 128 is of a different style than that shown in FIG. 4. Wherein in FIG. 4, the exposure table 48 has a glass table 46 upon which the image film 22 is laid, the exposure table 128 of FIG. 7 has an underlying vacuum blanket 130 on which the screen printing frame 42 and the image film 22 carrying the image 20 are laid. The vacuum blanket 130 and a glass table 132 of the exposure table 128 are part of an inner unit 134. The inner unit 134 is pivotably mounted to an outer unit 136. The glass table 132 is lowered down onto the screen printing frame 42 and the image film 22. The entire inner unit 134 is flipped relative to the outer unit 136 after the vacuum is drawn, so as to place the glass surface 132 in close proximity to a light source, not shown, which is underlying the vacuum blanket 130 at this point.

Still referring to FIG. 7, the second set of pins 124 depend downward from the lower surface 110 of the plate 106, as best seen in FIG. 6A, with a pair of the pins 124 received by an alignment means on the screen printing frame 42. In a preferred embodiment, the alignment means on the screen printing frame 42 is a pair of openings 62 in a pair of corner members 64 or in a pair of registration adapters 66 adjacent the two corner members 64 of the screen printing frame 42 associated with a tensioning roller 68. The groove 114 is adapted to receive a portion of the corner member 64 which projects from the surface on some designs of the screen printing frames 42. The first set of pins 122, which project upward from the upper surface 108 of the plate 106, are received by the holes 32 of the image film 22. The image film 22 has both circular and square holes 32 which receive the square shaped pins 122a and the one circular (cylindrical) shaped pin 122b of the pin registration bar 100 so that the image film 22 be mis-aligned.

Still referring to FIG. 7, in order to ensure that the films 22 and 40 do not move during the exposure by the light the glass table 132 is lowered onto the vacuum blanket 130. The vacuum blanket 130 of the exposure table 128 is pulled into engagement with the planar surface of the glass table 132, by a vacuum, therein preventing relative movement of the films 22 and 40.

Figure 8:
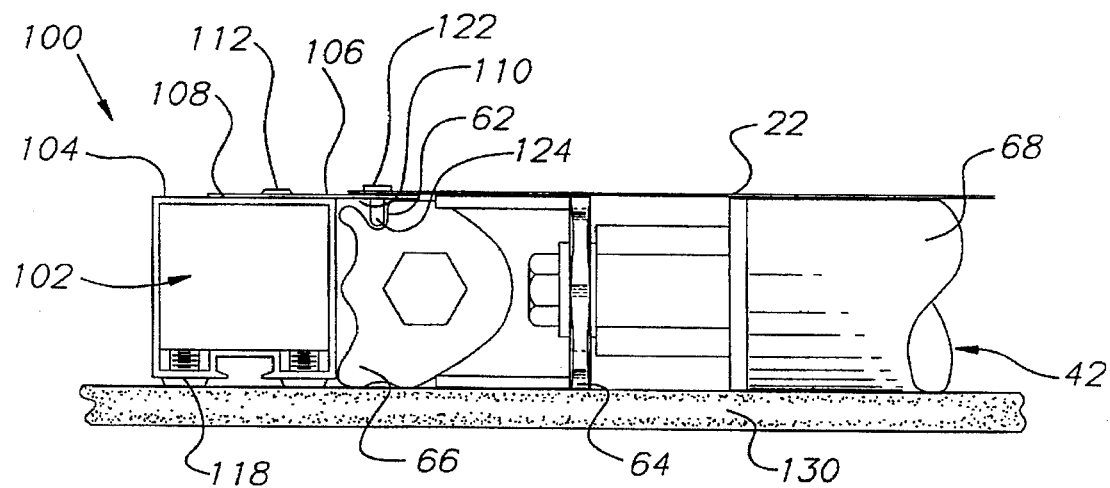
FIG. 8 is an end view of the pin registration bar on the vacuum blanket of the exposure table.

Referring to FIG. 8, one pin of the second set of pins 124 on each side of the center line "C" is received by an opening 62, such as a hole or a slot, located in corner members 64 or the registration adapter 66 of the screen printing frame 42. The openings 64 on the screen printing frame 42 are positioned such that those pins 124 which depend downward from the plate 106 of the pin registration bar 100, as best seen in FIG. 8, and are not received by the openings 64, do not interfere with the tensioning rollers 68. The pins 124 are located closer to the bar portion 102 of the pin registration bar 100 than the axis of the tensioning roller 68. U.S. Pat. No. 5,377,422 and U.S. patent application Ser. No. 08/347,752, now U.S. Pat. No. 5,522,148 disclose the openings carried by the screen printing frame 42 for alignment with the registration bar and are incorporated by reference.

Figure 1:
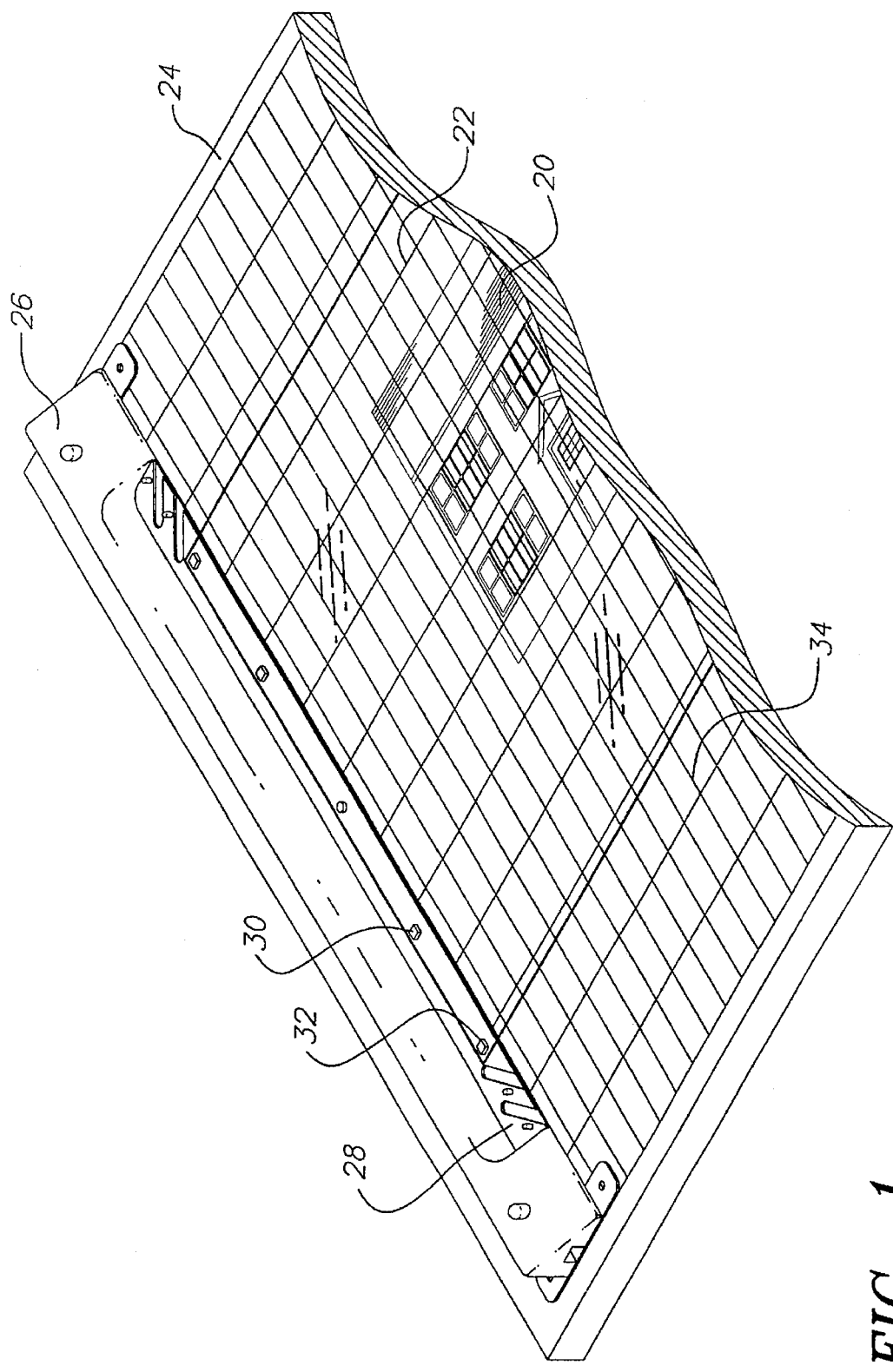
FIG. 1 is a perspective view of a prior art set up table.
Figure 3:
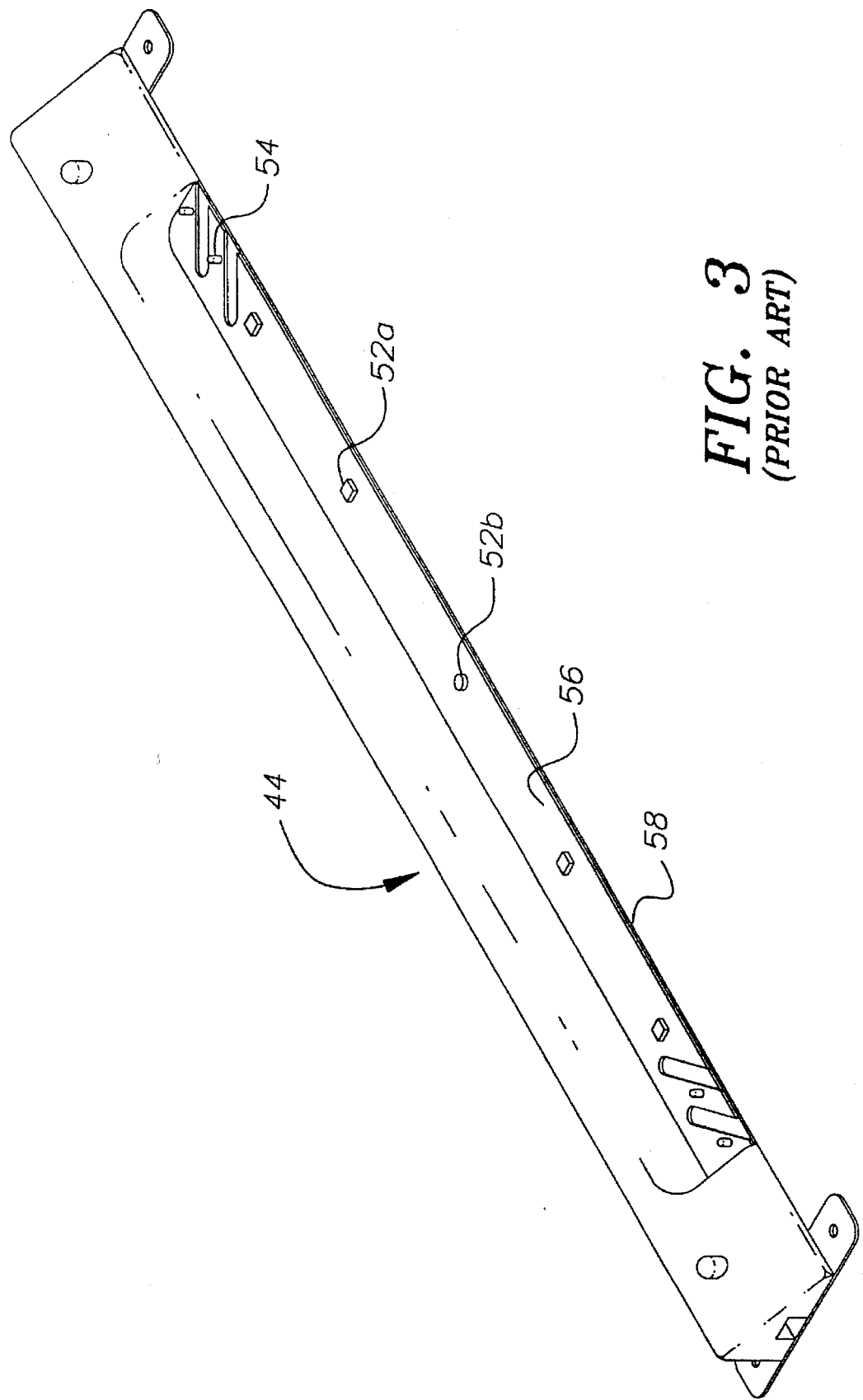
FIG. 3 is a perspective view of prior art pin registration bar.

Method of transferring image from image file to substrate,

For a screen printing job having numerous colors, the various images 20 are placed on various image films 22. Referring to FIG. 1, the various image films 22 are aligned on a lay-up board 24. The lay-up board 24 has a registration bar 26 secured to one end. The registration bar 26 has a plate 28 from which a first set of pins 30 project upward for receiving holes 32 in the image film 22. It is recognized that the lay-up board 24 shown has a second set of pins, which are not required on the lay-up board 24 in that the screen printing frame 42 is not placed on the lay-up board 24. The second set of pins are located on the plate 28 of the registration bar 26 simply to allow the use of the prior art pin registration bar 44 and thus reduce the number of styles of parts that need to be manufactured.

The various images (at least one for each color) are placed on a film in a photographic process which is well-known in the art. The film is either punched with the holes or aligned and secured on a carrier sheet having the holes to create the image films 22. After all the images 20 are aligned on the lay-up board 24 and the various image films 22 punched, the image 20 on each image film 22 needs to be transferred to the screen printing film 40 carried by the screen mesh 38.

Referring to FIG. 7, the screen printing frame 42 is laid on the vacuum blanket 130 of the exposure table 128. The pin registration bar 100 is positioned on the vacuum blanket 130 such that a pair of the second set of pins 124 is received by the openings 62 in the corner member 64 or registration adapter 66 of the screen printing frame 42. The end of the image film 22, which was secured to the pin registration bar 100, is secured to the screen printing frame 42, such as with tape.

Still referring to FIG. 7, the image film 22 is positioned on top of the screen mesh 38 of the screen printing frame 42 with the holes 32 of the image film 22 receiving the first set of pins 122 of the pin registration bar 100. The image film 22 is laid flat, and is secured to the screen printing frame 42, such as with tape. The image film 22 is lifted at the end engaging the pin registration bar 100, the end with the holes 32, to remove the first set of pins 122 on the plate 106 of the pin registration bar 100 from the holes 32. The pin registration bar 100 is lifted such that the second set of pins 124 are decoupled from the openings in the screen printing frame 42. The end of the image film 22, which was secured to the pin registration bar 100, is secured to the screen printing frame 42, such as with tape.

Figure 8A:
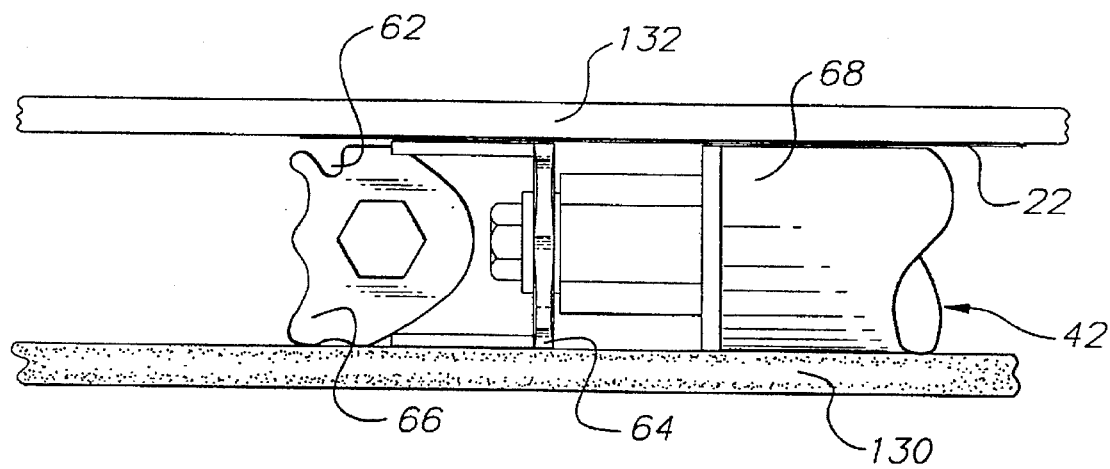
FIG. 8A is an end view of the screen printing frame on the exposure table with the pin registration bar removed.

Referring to FIG. 8A, with the pin registration bar 100 removed from the screen printing frame 42 and the exposure table 128, and the image film 22 secured to the screen printing frame 42, the glass table 132 is lowered into contact with the screen printing frame 42 with the overlying aligned image film 22 and the vacuum blanket 130. A vacuum is drawn between the glass table 132 and the vacuum blanket 130 to ensure that there is complete intimate contact of the image film 22 and the screen printing frame 42 and no movement of the image film 22 and the screen printing frame 42 and screen printing film 40 during exposure of the screen printing film 40. If a lateral force is exerted on the screen printing frame 42 during the drawing of the vacuum, both the screen printing frame 42 and the image film 22 will move together, therein maintaining alignment.

It is recognized that the alignment of the image film 22 with the screen printing frame 42 can be done at other locations besides the vacuum blanket 130 of the glass-up exposure table 128 in that the pin registration bar 100 is removed prior to exposure of the screen printing film 40 on the screen mesh 38 of the screen printing frame 42. Unlike prior art pin registration bars 44, the image film 20 and the screen mesh 38 are both accessible during alignment.

It is preferred to remove the pin registration bar 100 prior to drawing the vacuum. An additional benefit is that the pin registration bar 100 can be used to align a second image film 22 to a second screen printing frame 42, while the first is in the glass-up exposure table.

Referring to FIG. 7, the entire inner unit 134 of glass-up exposure table 128 is flipped relative to the outer unit 136 after the vacuum is drawn, so as to place the glass surface 132 in close proximity to a light source, not shown, which is underlying the vacuum blanket 130 at this point. This high intensity light which operates typically in a range of 390–460 nm, burns the image 20 located on the image film 22 into the screen printing film 40 by sending light through the image film 22 onto the screen printing film 40, at specific locations. The light sensitive coating or film 40 on the screen printing frame 42 exposed to the light hardens; the coating not exposed to light remains soft. Therein, the image 20 is transferred from the image film 22 to the screen printing film 40. With the image 22 on the screen mesh 38 of the screen printing frame 42, the screen mesh 38 including the screen printing film 40 is washed with water removing the soft light sensitive coating, so that the screen printing film 40 is ready to print.

Figure 5:
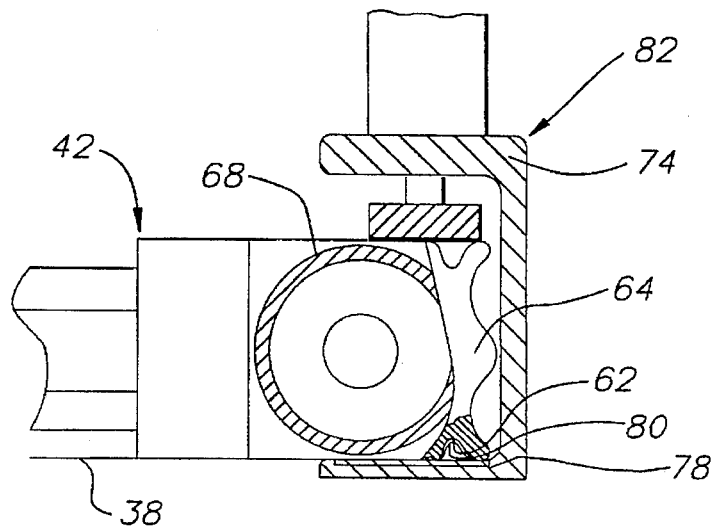
FIG. 5 is a side view of a screen frame in a screen printing machine.

Referring to FIG. 5, with the image 22 properly aligned and treated on the screen printing film 40 carried by the screen mesh 38 of the screen printing frame 42, the screen printing frame 42 is placed in a "U" shaped channel 74 of a screen printing machine. The "U" shaped channel 74 has a plate 78 through which a series of pins 80 project upward, only one seen. The "U" shaped channel 74 with the plate 78 and pins 80 acts as a registration apparatus 82. U.S. Pat. No. 5,377,422 discloses such a pin registration system for screen printing frames, and is incorporated herein by reference. The series of pins 80 are positioned similar to that of the second set of pins 54 on the pin registration bar 44. The hole (opening) 62 of the registration adapter 64 of the screen printing frame 42 receives one of the pins 80 located in the plate 78 to position the screen printing frame 42 relative to the registration apparatus 82 of the screen printing machine. The other registration adapter 64 of the screen printing frame 42, associated with another corner member 64, has a slot as the opening to assist in the alignment by preventing rotation of the screen printing frame 42 about the pins 80/hole 62 connection.

As briefly discussed above with respect to FIG. 8 and the pin registration bar 100, the pins 80 in the registration apparatus 82 are positioned in proximity to a base 84 of the "U" shaped channel 74 so that those pins 80 which do not align with the openings, such as a hole or a slot, 62 in the registration adapter 66, do not interfere with tensioning roller 64 of the screen printing frame 42.

With the screen printing frame 42 properly aligned in the screen printing machine, the screen printing frame 42 moves relative to the substrate to move the screen mesh 38 in proximity to the substrate, not shown, allowing the transfer of the image from the screen printing film 40 to the article. In that the image 22 has been aligned previously from the image film 22 to the screen printing film 40 on the screen printing frame 42, and the screen printing frame 42 has mounted precisely on the printing machine, the images from the multiple screen printing frames 42 on the printing machine should align precisely on the substrate. Any alignment of the screen printing frames 42 required, if any, within the printing machine should be minor to perfect the final image on the substrate.

The present invention may be embodied in other specific forms without departing from the spirit or essential attributes thereof and, accordingly, reference should be made to the appended claims, rather than to the foregoing specification, as indicating the scope of the invention.

What I claim is:

1. An apparatus for aligning an image film to a screen mesh of a screen printing frame, the apparatus comprising:
   a plate, the plate having a pair of generally parallel surfaces, the plate having two sets of pins, the first set of pins projecting upward from one of the parallel surfaces of the plate for aligning with holes in the film and the second set of pins projecting downward from the other parallel surface of the plate for aligning with holes in the screen frame.

2. An apparatus as in claim 1 wherein the second set of pins are distinctly shaped from the first set of pins.

3. An apparatus as in claim 2 wherein the apparatus has a center line and the first set of pins are symmetric about the center line and the second set of pins are outboard of the first set of pins.

4. An apparatus for aligning an image film to a screen mesh of a screen printing frame, the apparatus comprising:
   a bar having an upper surface, a lower surface, and a pair of side surfaces;
   a plate, the plate having a pair of generally parallel surfaces, a portion of one of the parallel surfaces engaging the upper surface of the bar, the plate mounted to the upper surface of the bar, the plate projecting outward over one of the side surfaces; and
   a pair of sets of pins, the first set of pins projects upward from the other parallel surface of the plate for aligning with holes in the image film, and the second set of pins projects downward from one of the parallel surfaces of the plate for aligning with openings carried by the screen printing frame.

5. An apparatus as in claim 4 wherein the distance between the upper surface and the lower surface of the bar is generally equal to the height of the screen printing frame.

6. An apparatus as in claim 5 wherein the bar has a plurality of adjustable legs carried by the lower surface of the bar for adjusting the height of the bar.

7. An apparatus as in claim 4 wherein the first set of pins includes five pins and four of the pins are square and the other pin is cylindrical.

8. An apparatus as in claim 4 wherein the plate has a series of grooves adapted to receive projections on the screen printing frame.

9. An apparatus for aligning an image film to a screen mesh of a screen printing frame, the apparatus comprising:

a plate, the plate having a pair of generally parallel surfaces, the plate having two sets of alignment means, the first set of alignment means adapted to couple with the image film located in proximity to one of the parallel surfaces of the plate for aligning the image film with the plate, and the second set of alignment means adapted to couple with the screen printing frame located in proximity to the other of the parallel surface of the plate for aligning the screen printing frame with the plate, therein aligning the image film with the screen mesh of the screen printing frame.

10. A method of placing an image on a screen mesh of a screen printing frame, comprising the following steps:

providing an image film having the image;

providing a light sensitive coating on the screen mesh;

placing the screen printing frame with the screen mesh upon an exposure table;

placing a registration bar having a bar, a plate, and a pair of sets of pins, on an exposure table such that the set of pins which projects downward from a parallel surface of the plate are accepted by an alignment means of the screen printing frame;

placing the image film on top of the screen mesh with the image film having holes receiving the second set of pins which project upward from the other parallel surface of the plate;

compressing the image film and the screen printing frame on the exposure table between a glass table and a vacuum blanket by drawing a vacuum;

exposing the light sensitive coating to the image of the image film;

removing the image film from engagement with the screen printing frame; and treating the screen fabric to retain the image on the light sensitive coating.

11. A method of placing an image on a screen mesh of a screen printing frame as in claim 10, further comprising the steps of securing the image film to the screen printing frame;

removing the registration bar prior to compressing the image film and the screen printing frame on the exposure table.

12. A method of placing an image on a screen mesh of a screen printing frame, comprising the following steps:

providing an image film having the image;

providing a light sensitive coating on the screen mesh;

placing the screen printing frame with the screen mesh upon a surface;

placing a registration bar having a bar, a plate, and a pair of sets of pins, on the surface such that the set of pins which projects downward from a parallel surface of the plate are accepted by an alignment means of the screen printing frame;

placing the image film on top of the screen mesh with the image film having holes receiving the second set of pins which projects upward from the other parallel surface of the plate;

securing the image film to the screen printing frame;

removing the registration bar;

placing the screen printing frame with the image film on an exposure table;

compressing the image film and the screen printing frame on the exposure table between a glass table and a vacuum blanket by drawing a vacuum;

exposing the light sensitive coating to the image of the image film;

removing the image film from engagement with the screen printing frame; and treating the screen fabric to retain the image on the light sensitive coating.

13. An apparatus for aligning a film to a screen frame comprising:

a bar having a height equal to the height of screen frame; and a plate secured to one side of the bar, the plate projecting from bar, the plate having an upper surface having a plurality of pins projecting upward for alignment with a plurality of holes in the film; and the plate having a lower surface having a plurality of pins projecting downward for alignment with a plurality of holes in the screen frame.

* * * * *